US012628565B2

(12) United States Patent
Nagaoka et al.

(10) Patent No.: US 12,628,565 B2
(45) Date of Patent: May 12, 2026

(54) PIEZOELECTRIC DEVICE HAVING ELECTRODE FORMED OF AMORPHOUS OXIDE CONDUCTOR

(71) Applicant: Nitto Denko Corporation, Ibaraki (JP)

(72) Inventors: Naoki Nagaoka, Ibaraki (JP); Daisuke Nakamura, Ibaraki (JP); Manami Kurose, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 880 days.

(21) Appl. No.: 17/279,538

(22) PCT Filed: Sep. 26, 2019

(86) PCT No.: PCT/JP2019/037942
§ 371 (c)(1),
(2) Date: Mar. 24, 2021

(87) PCT Pub. No.: WO2020/067330
PCT Pub. Date: Apr. 2, 2020

(65) Prior Publication Data
US 2021/0399202 A1 Dec. 23, 2021

(30) Foreign Application Priority Data

Sep. 28, 2018 (JP) ................................. 2018-185548
Sep. 24, 2019 (JP) ................................. 2019-173384

(51) Int. Cl.
*H01L 41/047* (2006.01)
*H01L 41/113* (2006.01)
(Continued)

(52) U.S. Cl.
CPC ........... *H10N 30/878* (2023.02); *H10N 30/06* (2023.02); *H10N 30/302* (2023.02); *H10N 30/853* (2023.02)

(58) Field of Classification Search
CPC .... H10N 30/06; H10N 30/302; H10N 30/853; H10N 30/878
(Continued)

(56) References Cited

U.S. PATENT DOCUMENTS 8,981,627 B2 3/2015 Sakuma et al.
2005/0194626 A1 9/2005 Noguchi et al.
(Continued)

FOREIGN PATENT DOCUMENTS

CN 1656623 A 8/2005
CN 1665043 A 9/2005
(Continued)

OTHER PUBLICATIONS

Yan et al., "Highly Transparent Bipolar Resistive Switching Memory in Zr0.5Hf0.5O2 Films With Amorphous Semiconducting In—Ga—Zn—O as Electrode," IEEE Transactions on Electron Devices, Oct. 2015, vol. 62, No. 10, pp. 3244-3249; Cited in NPL No. 1 filed on Jun. 14, 2022.
(Continued)

*Primary Examiner* — Emily P Pham
*Assistant Examiner* — Monica Mata
(74) *Attorney, Agent, or Firm* — HAUPTMAN HAM, LLP

(57) ABSTRACT

A piezoelectric device that exhibits good piezoelectric characteristics, while reducing generation of leakage current paths, and a method of manufacturing the same, are provided. The piezoelectric device has a multilayer stack in which a first electrode, a piezoelectric layer, and a second electrode are stacked in this order on a substrate, wherein at least the first electrode is formed of an amorphous oxide conductor.

11 Claims, 6 Drawing Sheets

10

(51) Int. Cl.

| | | |
|---|---|---|
| *H01L 41/187* | (2006.01) | |
| *H01L 41/29* | (2013.01) | |
| *H10N 30/06* | (2023.01) | |
| *H10N 30/30* | (2023.01) | |
| *H10N 30/853* | (2023.01) | |
| *H10N 30/87* | (2023.01) | |

(58) Field of Classification Search
USPC .......................................................... 310/358
See application file for complete search history.

(56) References Cited

U.S. PATENT DOCUMENTS

| | | | |
|---|---|---|---|
| 2005/0236710 A1 | 10/2005 | Akiyama et al. | |
| 2008/0296529 A1 | 12/2008 | Akiyama et al. | |
| 2010/0067167 A1 | 3/2010 | Riekkinen et al. | |
| 2014/0111064 A1* | 4/2014 | Zuo ........................ | H03H 9/205 |
| | | | 310/365 |
| 2014/0276247 A1* | 9/2014 | Hall ..................... | A61N 5/0616 |
| | | | 604/20 |
| 2014/0285069 A1 | 9/2014 | Suenaga et al. | |
| 2016/0238466 A1 | 8/2016 | Tanimoto et al. | |
| 2020/0381610 A1* | 12/2020 | Arimoto .............. | H10N 30/076 |

FOREIGN PATENT DOCUMENTS

| | | |
|---|---|---|
| CN | 104078560 A | 10/2014 |
| EP | 3 035 022 A1 | 6/2016 |
| EP | 3 859 799 A1 | 8/2021 |
| JP | H11-330388 A | 11/1999 |
| JP | 2004-75511 A | 3/2004 |
| JP | 2005-252069 A | 9/2005 |
| JP | 2009-10926 A | 1/2009 |
| JP | 2015-519720 A | 7/2015 |
| JP | 2015-186909 A | 10/2015 |
| JP | 2017-183414 A | 10/2017 |
| WO | 2015/053089 A1 | 4/2015 |
| WO | 2017/209081 A1 | 12/2017 |

OTHER PUBLICATIONS

Office Action issued on Nov. 2, 2021, for Japanese Patent Application No. 2019-173384, along with an English translation.

Office Action issued on Mar. 8, 2022, for Japanese Patent Application No. 2019-173384, along with an English translation.

Extended European Search Report issued on Jun. 8, 2022, in connection with European Patent Application No. 19867664.5.

Yan et al., "Highly Transparent Bipolar Resistive Switching Memory in Zr0.5Hf0.5O2 Films With Amorphous Semiconducting In—Ga—Zn—O as Eectrode," IEEE Transactions on Electron Devices, Oct. 2015, vol. 62, No. 10, pp. 3244-3249; Cited in NPL No. 1.

Office Action issued on Jul. 19, 2023 for corresponding Korean Patent Application No. 10-2021-7008852, along with an English translation (13 pages).

Office Action(Decision of Dismissal of Amendment) issued on Jul. 5, 2022, for corresponding Japanese Patent Application No. 2019-173384, along with an English machine translation.

Office Action(Decision of Refusal) issued on Jul. 5, 2022, for corresponding Japanese Patent Application No. 2019-173384, along with an English machine translation.

International Search Report issued for corresponding International Patent Application No. PCT/JP2019/037942 on Dec. 10, 2019, along with an English translation.

Written Opinion issued for corresponding International Patent Application No. PCT/JP2019/037942 on Dec. 10, 2019.

Office Action issued on May 22, 2024 for corresponding Chinese Patent Application No. 201980062690.4, along with an English translation (21 pages).

Office Action issued on Nov. 22, 2023 for corresponding Chinese Patent Application No. 201980062690.4, along with an English translation (22 pages).

Xixin, "Thin Film Physics", Shanghai Science and Technology Press, First Edition, p. 178, Oct. 1986, along with an English translation (5 pages), cited in NPL No. 1.

* cited by examiner

| | Sample No. 1 | Sample No. 2 | Sample No. 3 | Sample No. 4 | Sample No. 5 |
|---|---|---|---|---|---|
| BOTTOM ELECTRODE | IZO (10 nm) | IZO (50 nm) | IZO (100 nm) | amorphous-ITO $O_2/(Ar+O_2)$ Ratio: 0% | amorphous-ITO $O_2/(Ar+O_2)$ Ratio: 1.5% |
| STRUCTURE | ZnO / IZO / Sub. | | | ZnO / amorphous-ITO (50 nm) / Sub. | |
| CRYSTAL ORIENTATION (XRC-FWHM) | 4.4° ○ | 3.3° ◎ | 3.7° ◎ | 4.0° ○ | 3.5° ◎ |
| HAZE (%) | 1.7 ○ | 1.4 ○ | 1.4 ○ | 0.9 ◎ | 0.7 ◎ |
| PIEZOELECTRIC CHARACTERISTIC d33 [pC/N] | 2.2 ○ | 5.0 ◎ | 4.3 ◎ | 2.0 ○ | 2.6 ○ |

FIG.5

| | Comparative Example 1 | Comparative Example 2 | | Comparative Example 3 | |
|---|---|---|---|---|---|
| BOTTOM ELECTRODE | Ti | Al | | crystalline-ITO $O_2/(Ar+O_2)$ Ratio: 4.8% | |
| STRUCTURE | ZnO Ti: 50 nm Sub. | ZnO Al: 50 nm Sub. | | ZnO crystalline-ITO (50 nm) Sub. | |
| CRYSTAL ORIENTATION (XRC-FWHM) | 5.7° ○ | 19.5° ✕ | | 10.0° ✕ | |
| HAZE (%) | untransparent n/a | untransparent n/a | | 1.0 ○ | |
| PIEZOELECTRIC CHARACTERISTIC d33 [pC/N] | 0 ✕ | 0 ✕ | | 0 ✕ | |

PIEZOELECTRIC DEVICE HAVING ELECTRODE FORMED OF AMORPHOUS OXIDE CONDUCTOR

CROSS REFERENCE TO RELATED APPLICATION

This application is a National Stage of International Application No. PCT/JP2019/037942, filed on Sep. 26, 2019, which designates the United States and was published in Japan, and which is based upon and claims priority to Japanese Patent Application Nos. 1) 2018-185548, filed on Sep. 28, 2018; and 2) 2019-173384, filed on Sep. 24, 2019 in the Japan Patent Office. All of the aforementioned applications (including the earlier-filed Japanese Patent Applications) are hereby incorporated by reference in their entireties.

TECHNICAL FIELD

The present invention relates to a piezoelectric device and a method of manufacturing the same.

BACKGROUND ART

Piezoelectric devices, which make use of the piezoelectric effect of substances, have conventionally been adopted. The piezoelectric effect is a phenomenon in which microscopic polarization is produced in response to a mechanical stress applied to a substance. Using the piezoelectric effect, various sensors including pressure sensors, acceleration sensors, and acoustic emission 36256AE) sensors for detecting elastic waves are commercially available.

Piezoelectric devices are typically formed into a multilayer stack with a piezoelectric layer sandwiched between a pair of electrodes. A structure having electrode films made of a metal alloy such as Ti-alloy, Mg-alloy, Al-alloy, Zn-alloy or the like is proposed. With this structure, the Young's modulus of the electrode films is set smaller than that of the piezoelectric layer. See, for example, Patent Document 1 presented below. It is described in this document that the electrode films preferably have an unoriented or amorphous structure.

SUMMARY OF THE INVENTION

Technical Problem to be Solved

A multilayer stack with a piezoelectric layer sandwiched between a pair of electrodes is generally fabricated on a substrate, from the viewpoint of structural stability and convenience of fabrication approach. When a plastic or resin substrate is used, the surface of the substrate tends to be rough or uneven. Such surface roughness or unevenness of the substrate is hardly absorbed by the metal crystal of the subsequently formed electrode, and in fact, the surface of the metal electrode formed on the uneven substrate becomes uneven. The unevenness or pinholes present in the metal surface may cause cracks in a piezoelectric layer formed over the metal film, and leakage current paths may be created between the top and bottom electrodes. Such leakage current paths diminish the electric charges produced by polarization and accumulated at the interfaces of the piezoelectric layer, and consequently, the piezoelectric effect may not be exhibited.

One of the objectives of the present invention is to suppress a leakage current path and provide a piezoelectric device having a satisfactory piezoelectric characteristic and a method of manufacturing the same.

Technical Solution(s)

In one aspect of the invention, one or both of a pair of electrodes is formed of an amorphous oxide conductor. In particular, a piezoelectric device includes a first electrode, a piezoelectric layer, and a second electrode stacked in this order on a substrate, wherein at least the first electrode is formed of an amorphous oxide conductor.

In an example configuration, the thickness of the first electrode may range from 10 nm to 200 nm, and more preferably, 10 nm to 100 nm.

Advantageous Effect of the Invention

With the above-described configuration, the leakage current path can be suppressed, and a piezoelectric device with a satisfactory piezoelectric characteristic can be achieved.

BRIEF DESCRIPTION OF DRAWINGS

FIG. 4 shows measurement results of the samples;

FIG. 5 shows measurement results of comparative structures;

DESCRIPTION OF PREFERRED EMBODIMENTS

In general, when a piezoelectric layer is formed of a wurtzite material such as zinc oxide (ZnO), it is believed that depositing a crystal film under the piezoelectric layer is desirable because a wurtzite layer can be grown with a good crystal orientation, reflecting the underlayer crystal structure.

It is also assumed that the piezoelectric layer should have a certain degree of thickness in order to secure the crystal orientation of the piezoelectric layer. However, increasing the thickness of the piezoelectric layer tends to cause cracking or crazing in the piezoelectric layer. In particular, when the surface of the underlaid metal electrode is uneven, cracks or pinholes are likely to appear after the piezoelectric layer has been fabricated.

Cracks or crazing produced in the piezoelectric layer will cause leakage current paths. Due to the leakage current path, the electric charges generated by polarization disappear and the piezoelectric characteristics are impaired.

In the embodiments to be described below, of the pair of electrodes sandwiching the piezoelectric layer, at least an electrode provided between the substrate and the piezoelectric layer, which may be referred to as a "bottom electrode", is configured to be an amorphous transparent oxide conductor. This configuration can absorb the unevenness or roughness of the substrate surface, thereby suppressing leakage current paths and achieving satisfactory piezoelectric characteristics.

Figure 1:
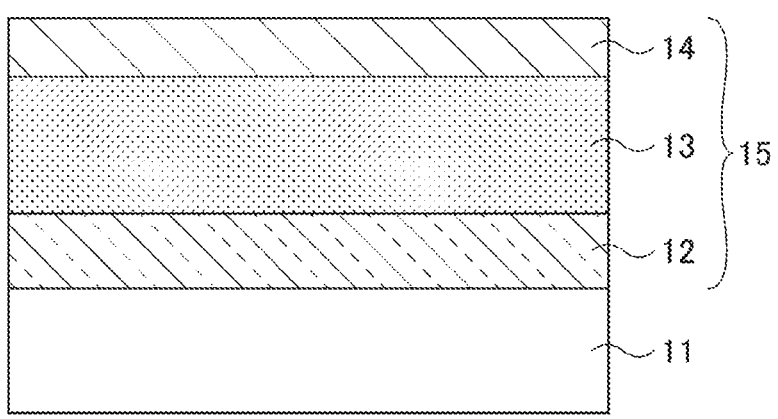
FIG. 1 is a schematic diagram of a piezoelectric device according to an embodiment.

FIG. 1 is a schematic diagram of a piezoelectric device 10. The piezoelectric device 10 is applied to, for example, a piezoelectric pressure sensor configured to detect a pressure applied to the device and output the detection result as an electric signal. The piezoelectric device 10 has a multilayer stack 15, in which a first electrode 12, a piezoelectric layer 13, and a second electrode 14 are stacked in this order, on a substrate 11. The term "on" the substrate 11 does not means the absolute direction, and it simply represents an upper side in the stacking direction relative to the substrate.

In the configuration of FIG. 1, the first electrode 12 may be called a "bottom electrode" and the second electrode 14 may be called a "top electrode." Of the two electrodes, at least the first electrode 12 is fabricated as an amorphous oxide conductor. The amorphous oxide conductor may be "transparent" to visible light, or "transparent" with respect to light having a specified wavelength or falling within a specified wavelength band, depending on the situation.

Examples of the amorphous oxide conductor include, but are not limited to, indium tin oxide (ITO), indium zinc oxide (IZO), indium zinc tin oxide (IZTO), indium gallium zinc oxide (IGZO), etc.

When ITO is used, the tin (Sn) content with respect to the total of Sn and In (i.e., the ratio $Sn/(In+Sn)$) is, for example, 5 to 15 wt %. Within this range, the ITO is transparent to visible light and an amorphous film can be formed by sputtering at room temperature.

When IZO is used, the zinc (Zn) content with respect to the total of Zn and In (i.e., the ratio $Zn/(In+Zn)$) is, for example, around 10 wt %. IZO with this Zn content is also transparent to visible light, and an amorphous IZO film can be formed by sputtering at room temperature.

When IZTO is used, the In content with respect to the total of In, Zn and Ti (i.e., the ratio $In/(In+Zn+Ti)$) is, for example, 15 to 35 wt %. When IGZO is used, the In content with respect to the total of In, Ga and Ti (i.e., the ratio $In/(In+Ga+Zn)$) is, for example, 15 to 35 wt %. Both IZTO and IGZO with the above-described In content are transparent to visible light, and have high carrier mobility. IZTO and IGZO can be formed in amorphous films at room temperature.

Films of these amorphous oxide conductors may be formed in an argon (Ar) atmosphere, or in a mixed gas of Ar and a small quantity of oxygen ($O_2$). Preferably, the ratio of the $O_2$ flow to the total flow of Ar and $O_2$ ranges from 0% to 2.0%, and more preferably 0% to 1.5%. The reasoning for the preferred range of the flow ratio will be explained later.

For the substrate 11, any suitable material may be used. Either an inorganic substrate such as a glass substrate, a sapphire substrate, an MgO substrate, etc., or a plastic substrate may be used. When a plastic substrate is used, and when the first electrode 12 of an amorphous transparent oxide conductor is formed over the plastic surface, the advantageous effect of suppressing leakage current paths can be exhibited more significantly. Although the surface of a plastic substrate or a resin substrate tends to be uneven, the first electrode 12 of an amorphous oxide conductor can absorb the unevenness of the substrate surface, and can improve the crystal orientation of an upper layer, i.e., the piezoelectric layer to be subsequently formed on the first electrode 12.

When the substrate 11 is formed of plastic, polyethylene terephthalate (PET), polyethylene naphthalate (PEN), polycarbonate (PC), acrylic resin, cycloolefin polymer, polyimide (PI) or the like may be used. Among these materials, PET, PEN, PC, acrylic resin, and cycloolefin polymer are colorless and transparent materials, and are suitably used when the first electrode 12 is located on the light incident side.

The piezoelectric layer 13 is formed of a piezoelectric material having a wurtzite crystal structure, and has a thickness of 20 nm to 250 nm. When the thickness of the piezoelectric layer 13 is within this range, cracking or crazing can be suppressed. When the thickness of the piezoelectric layer 13 exceeds 250 nm, cracking or crazing is likely to increase, and the haze value (or crystal opacity) is adversely affected.

When the thickness of the piezoelectric layer 13 is less than 20 nm, it is difficult to obtain good crystal orientation, and is difficult to achieve satisfactory piezoelectric characteristics (or polarization characteristics according to applied pressure). Preferably, the thickness of the piezoelectric layer 13 is 30 nm to 200 nm, and more preferably, 50 nm to 100 nm.

The crystal structure of a wurtzite has general formula AB, where A is a positive element ($A''^+$) and B is a negative element ($B''^-$). It is desirable for a wurtzite piezoelectric material to exhibit piezoelectric characteristics of a certain level or higher and to be crystallized in a low temperature process at or below 200° C. For example, zinc oxide (ZnO), zinc sulfide (ZnS), zinc selenide (ZnSe), zinc telluride (ZnTe), aluminum nitride (AlN), gallium nitride (GaN), cadmium selenide (CdSe), cadmium telluride (CdTe), silicon carbide (SiC), etc. can be used. Only one of these compounds may be used, or alternatively, a combination of two or more of these compounds may be used.

When two or more of these compounds are combined, each of the selected compounds may be stacked one by one, or a single layer may be formed using multiple targets of the respective compounds. The selected one of the above-described compounds or a combination of two or more compounds may be used as the main component that dominantly forms the wurtzite crystal, and another component may be optionally added as a subcomponent. The percentage or ratio of the subcomponent contained in the main component is not particularly limited as long as the advantageous effect of the present invention is acquired. When a subcomponent is added to the main component, the content of the subcomponent may be 0.1 at. % to 20 at. %, preferably, 0.1 at. % to 10 at. %, and more preferably, 0.2 at. % to 5 at. %.

In one example, a wurtzite material formed of ZnO or AlN as the main component is used. A metal that does not exhibit conductivity when added to the main component (ZnO, AlN, etc.) may be used as a dopant or a subcomponent. Examples of such a metal dopant include, but not limited to silicon (Si), magnesium (Mg), vanadium (V), titanium (Ti), zirconium (Zr), lithium (Li), etc. A single dopant may be added, or a combination of two or more dopants may be added in combination. By adding a metal dopant, the likelihood of cracking or crazing can be reduced. When a transparent wurtzite crystal material is used as the piezoelectric layer 13, it is suitable for application to a display.

Because the piezoelectric layer 13 is provided on the first electrode 12 that is formed as an amorphous oxide conductor, it is unnecessary to insert a specific crystal-orientation film under the piezoelectric layer 13. This is because the first electrode 12 serves not only as the electrode but also as an underlayer for improving the crystal orientation of the piezoelectric layer 13.

The second electrode 14 may be formed of an amorphous transparent oxide conductor, or it may be formed of a metal, an alloy, or a non-transparent conductor. When an amorphous transparent oxide conductor is used for the second electrode, it may be made of the same material as the first electrode 12, or it may be made of a different material.

The piezoelectric device 10 of FIG. 1 can be manufactured by the following steps. A first electrode 12 is formed as an amorphous oxide conductor on the substrate 11. For the first electrode 12, an ITO film, an IZO film, an IZTO film, an IGZO film, etc. may be formed by direct current (DC) or radio frequency (RF) magnetron sputtering in an Ar atmosphere or in a mixed gas atmosphere with Ar and a predetermined ratio of $O_2$. Depending on the application of the device, the first electrode 12 may be formed as a solid electrode layer, or it may be patterned into a predetermined shape by etching or other suitable process. When the piezoelectric device 10 is applied to a pressure sensor used for a touch panel, the first electrode 12 may have a pattern of strips extending parallel to the first direction.

Then, the piezoelectric layer 13 may be formed on the first electrode 12 by, for example, RF magnetron sputtering using a ZnO target in a mixed gas atmosphere of Ar and a small quantity of $O_2$. The thickness of the ZnO piezoelectric layer 13 is 20 nm to 250 nm. The temperature of forming the ZnO film is not necessarily room temperature as long as the amorphous state is maintained in the first electrode 12. The ZnO film may be formed at, for example, a substrate temperature of 150° C. or lower.

By using the sputtering method for forming the first electrode 12 and the piezoelectric layer 13, uniform films having good adhesion can be formed, while maintaining the composition ratios of the targets almost unchanged. In addition, films with desired thicknesses can be formed accurately by simply controlling the sputtering time.

Next, the second electrode 14 is formed in a predetermined pattern on the piezoelectric layer 13. For the second electrode 14, an ITO film with a thickness of 20 nm to 100 nm is formed at room temperature by, for example, DC or RF magnetron sputtering. The second electrode 14 may be formed over the entire surface of the substrate. Alternatively, when the first electrode 12 is patterned into stripes, the second electrode 14 may also be patterned into stripes extending in the direction orthogonal to the stripes of the first electrode 12. Thus, the piezoelectric device 10 can be fabricated. The characteristics of the fabricated piezoelectric device 10 are examined using several samples.

Figure 2:
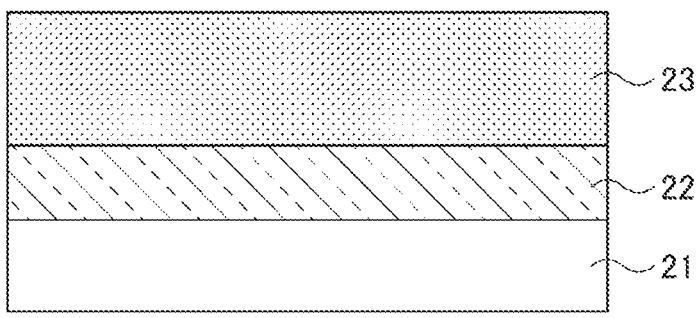
FIG. 2 is a schematic diagram of a sample used for characteristic evaluation.

FIG. 2 is a schematic diagram of a sample 20 used for characteristic evaluation. The first electrode 22 and the piezoelectric layer 23 are provided in this order on the substrate 21. The substrate 21 is a PET film with a thickness of 50 μm. The first electrode 22 is a thin film of an amorphous oxide conductor formed by magnetron sputtering at room temperature. For the characteristic measurement described later, three types of samples 20 having different materials and different thicknesses of the first electrode 22 are fabricated. In addition, two other samples 20 are fabricated changing the flow ratio of Ar and $O_2$ when forming the first electrode 22.

The piezoelectric layer 23 is a ZnO film with a thickness of 200 nm grown at room temperature. Samples 20, each having a size of 3 mm×3 mm. In the characteristic measurement of the samples 20, the crystal orientation of the piezoelectric layer 23, the haze value (or the opacity), and the d33 value representing a piezoelectric characteristic, are measured.

The crystal orientation is determined by the X-ray rocking curve (XRC) method, measuring the reflection from (002) plane of the ZnO film. The locking curve of the (002) reflection represents the fluctuation of the orientation of the crystal axis of ZnO in the c-axis direction. The smaller the full width at half maximum (FWHM) of the X-ray locking curve, the better the c-axis orientation of the crystal.

The haze value (or the opacity) indicates the degree of opacity of a crystal, and is represented as the percentage of the scattered component of the light passing through the material to the total transmitted light. The smaller the haze value, the higher the transparency. A haze meter manufactured by Suga Test Instruments Co., Ltd. is used to measure the haze.

Parameter d33 represents contraction or expansion in the thickness direction, which is defined by the amount of polarization charges per unit pressure applied in the thickness direction. The d33 parameter is often called "piezoelectric coefficient". The higher the d33 value, the better the polarization characteristic in the thickness direction.

Figure 3:
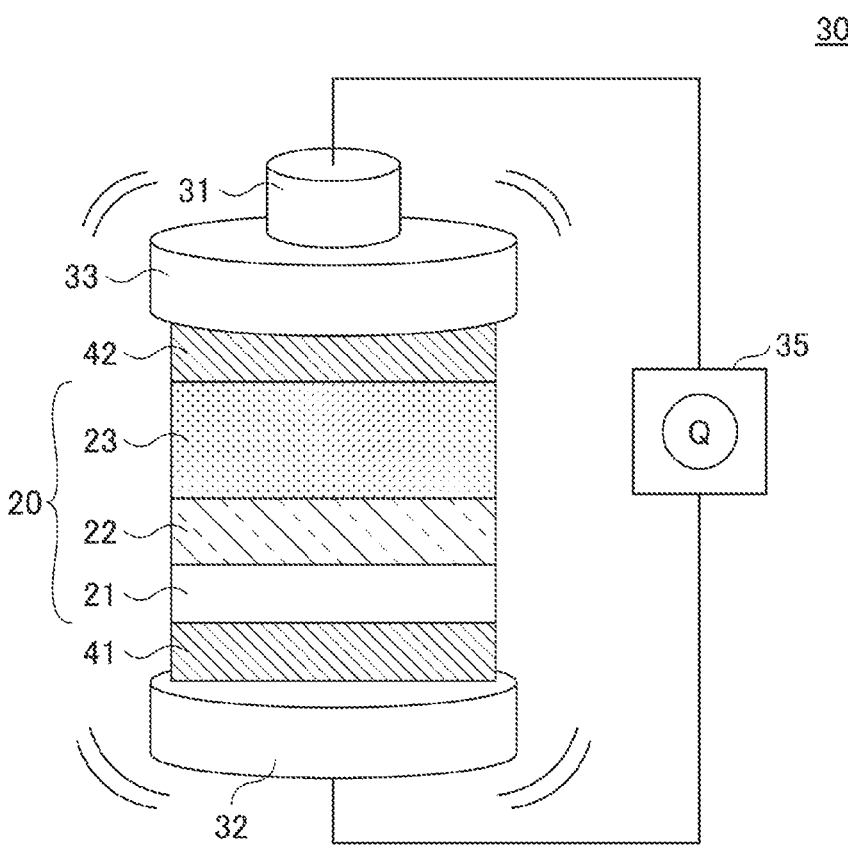
FIG. 3 illustrated how piezoelectric coefficient d33 values are measured.

FIG. 3 illustrates a setup for measuring the d33 parameter. As the measuring instrument 30, a piezometer PM300 manufactured by Piezotest Limited is used to directly measure d33 values. Prior to the measurement, aluminum (Al) films 41 and 42 are provided to the bottom and the top of the sample 20, respectively, by attaching aluminum foil onto the back face of the substrate 21 and the top face of the piezoelectric layer 23. The sample 20 with Al films 41 and 42 is placed between the electrodes 31 and 32 of the measuring instrument 30.

A load is applied at a low frequency by the indenter 33 to the sample 20 from the upper side of the piezoelectric layer 23, and the amount of electric charges generated is measured by the coulomb meter 35. The value calculated by dividing the measured electric charges by the applied load is d33.

FIG. 4 shows the evaluation results of five samples. Sample No. 1 to Sample No. 3 are prepared changing the material and the thickness of the first electrode 22, while fixing the percentage of the $O_2$ flow in the total atmosphere containing Ar and $O_2$ to 1.0%. Sample No. 4 and Sample No. 5 are prepared by changing the flow ratio of $O_2$ with respect to the total atmosphere when forming the first electrode 22. The sample parameters to be considered include the material and the thickness of the first electrode 22, the flow ratio $O_2/(Ar+O_2)$, the c-axis orientation of the piezoelectric layer 23, the haze (opacity), and the d33 value. Together with the measurements of the c-axis orientation, haze, and d33, evaluations are marked with symbols. The evaluation with a good score is marked with a double circle (⊚), the evaluation with an acceptable score is marked with an open circle (○), and the evaluation out of the acceptable range is marked with a cross marks (x).

In Sample No. 1, an IZO film with a thickness of 10 nm is formed as the first electrode 22 on a PET film substrate 21, and a ZnO film with a thickness of 200 nm is provided on the IZO film. The ratio of Zn to the total of In and Zn in the IZO film is 10 wt %.

The FWHM of X-ray rocking curve (XRC) of Sample No. 1 is 4.4°, which is within an acceptable range for c-axis orientation. The haze value is 1.7%, and transparency is sufficient. The d33 value is 2.2 (pC/N), and the polarization characteristic in the thickness direction is good.

In Sample No. 2, an IZO film with a thickness of 50 nm is formed as the first electrode 22 on the PET film substrate 21, and a ZnO film with a thickness of 200 nm is provided on the IZO film. The ratio of Zn to the total of In and Zn in the IZO film is 10 wt %.

The FWHM of XRC of Sample No. 2 is as small as 3.3°, which shows good c-axis orientation. The haze value is 1.4%, and transparency is sufficient. The d33 value is 5.0 (pC/N), and the polarization characteristic in the thickness direction is very good.

In Sample No. 3, an IZO film with a thickness of 100 nm is formed as the first electrode 22 on the PET film substrate 21, and a ZnO film with a thickness of 200 nm is provided on the IZO film. The ratio of Zn to the total of In and Zn in the IZO film is 10 wt %.

The FWHM of XRC of Sample No. 3 is 3.7°, which shows good c-axis orientation. The haze value is 1.4%, and transparency is sufficient. The d33 value is 4.3 (pC/N), and the polarization characteristic in the thickness direction is good.

In Sample No. 4, an ITO film with a thickness of 50 nm is formed as the first electrode 22 on the PET film substrate 21, and a ZnO film with a thickness of 200 nm is provided on the ITO film. The ratio of Sn to the total of In and Sn in the ITO film is 10 wt %. The source gas for forming the first electrode 22 is Ar gas only (which means that the $O_2$ flow ratio is zero percent).

The FWHM of XRC of Sample No. 4 is 4.0°, which is in the acceptable range for c-axis orientation. The haze value is 0.9%, and the sample is highly transparent. The d33 value is 2.0 (pC/N), and the polarization characteristic in the thickness direction is good.

In Sample No. 5, an ITO film with a thickness of 50 nm is formed as the first electrode 22 on the PET film substrate 21, and a ZnO film with a thickness of 200 nm is provided on the ITO film. The ratio of Sn to the total of In and Sn in the ITO film is 10 wt %. The oxygen ratio in the source gas for forming the first electrode 22, namely, the flow ratio of $O_2$ with respect to the total of Ar and $O_2$ is 1.5%.

The FWHM of XRC of Sample No. 5 is as small as 3.5°, which shows good c-axis orientation. The haze value is 0.7%, and the sample is highly transparent. The d33 value is 2.6 (pC/N), and the polarization characteristic in the thickness direction is good.

From the results of Sample Nos. 4 and 5, it is understood that with a small amount of $O_2$ gas mixed in the source gas for forming the transparent conductive film, the amorphous state of the conductive electrode film is maintained, and that the c-axis orientation and transparency of the subsequently formed piezoelectric layer are improved.

All of the five samples (Sample No. 1 to Sample No. 5) exhibit good or acceptable c-axis orientation of the ZnO piezoelectric layer 23. This is because by forming the first electrode 22 as an amorphous oxide conductor, the crystal orientation of the ZnO film grown on the first electrode 22 is improved.

Besides, when the first electrode 22 is formed as an amorphous oxide conductor on the substrate 21 made of a resin or plastic, it is inferred that the unevenness of the surface of the resin or plastic substrate 21 is absorbed by the upper layer electrode, and that the surface roughness of the first electrode 22 is reduced. The grain boundaries are reduced at the interface between the first electrode 22 and the piezoelectric layer 23, and cracking or leakage current paths are suppressed.

From the above, it is understood that by selecting the film thickness of the first electrode 22 of an amorphous oxide conductor from the range at least 10 nm to 100 nm, the crystallinity and piezoelectric characteristics of the piezoelectric layer 23 provided on the first electrode 22 are improved. When a predetermined quantity of $O_2$ gas is mixed in the Ar gas flow during the film formation of the first electrode 22, the transparency of the electrode is improved, while maintaining the amorphous state. An appropriate range of the $O_2$ flow ratio for maintaining the amorphous state will be described later with reference to FIG. 7.

Comparative Examples

FIG. 5 shows measurement results of other configurations for comparisons. Comparative Examples 1 and 2 show the crystal characteristics and piezoelectric characteristics of ZnO when a metal electrode is formed on the substrate 21. Comparative Example 3 shows the crystal characteristics and piezoelectric characteristics of ZnO when a crystalline ITO film is formed on the substrate 21. In Comparative Example 3, the oxygen content in the source gas during film formation of the first electrode 22 is 4.8%. The material and the thickness of the substrate 21 are the same as those in the sample 20 of the example.

In Comparative Example 1, a Ti film having a thickness of 50 nm is formed on the substrate 21, and a ZnO film is formed as the piezoelectric layer 23 on the Ti film. The XRC-FWHM of Comparative Example 1 is 5.7°, which is broader than those of Sample No. 1 to Sample No. 3 of the above-described examples, whereas the c-axis orientation is within the acceptable range. Regarding the transparency of the crystal, opacity is visually observed, and the sample is not transparent even without measuring the haze value.

As for the d33 value, no polarization is sensed at the resolution of the measuring instrument used, which means that the piezoelectric characteristic is poor. This comparative configuration cannot be applied to a piezoelectric sensor.

In Comparative Example 2, an Al film having a thickness of 50 nm is formed on the substrate 21, and a ZnO film is formed as the piezoelectric layer 23 on the Al film. The XRC-FWHM of Comparative Example 2 is as broad as 19.5°, and the c-axis orientation is out of the acceptable range. Regarding the transparency of the crystal, opacity is visually observed, and the sample is not transparent even without measuring the haze value. As for the polarization characteristics, no polarization is sensed by the measuring instrument used, and therefore, d33 is zero.

Figure 6:
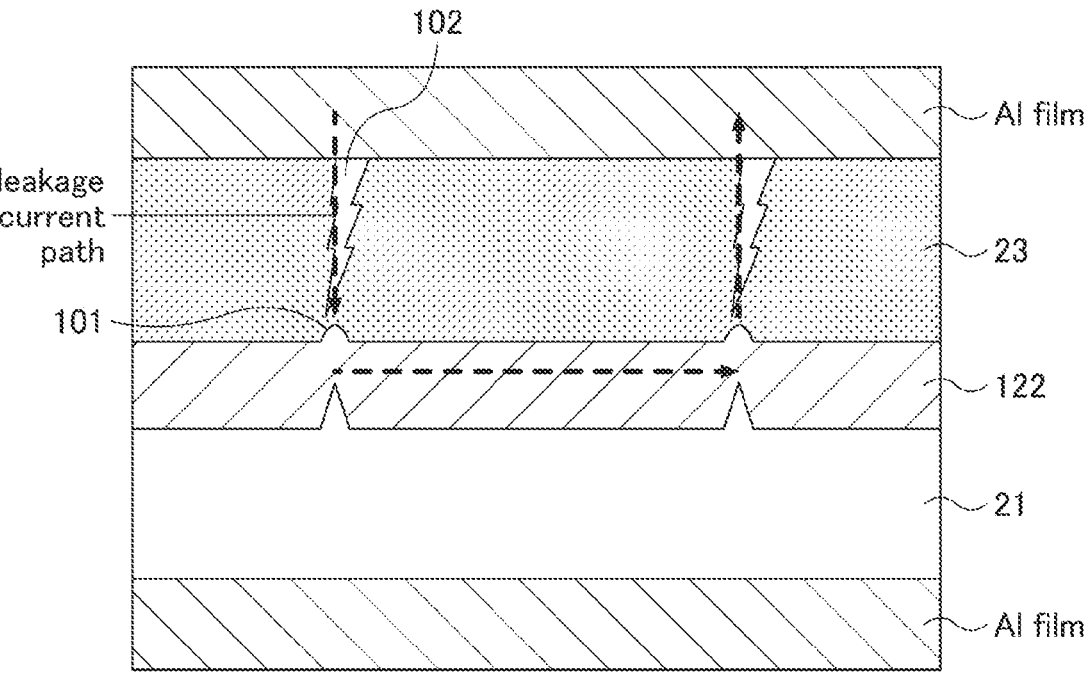
FIG. 6 illustrates how the piezoelectric characteristics deteriorate when a metal electrode film is provided under the piezoelectric layer.

FIG. 6 is a diagram for explaining the reason for the deficiency in the d33 value in Comparative Examples 1 and 2. With a plastic or resin substrate 21, the surface tends to become uneven due to the film formation process or the flexibility of the material itself. When a metal electrode film 122 is formed on the uneven surface of the substrate 21, the metal crystal of the electrode film 122 cannot sufficiently absorb the unevenness of the substrate surface, and protrusions are formed in the surface of the electrode film 122.

When the piezoelectric layer 23 is formed on the metal electrode film 122, cracks 102 may occur in the piezoelectric layer 23 due to the uneven surface of the electrode film 122. Thereby leakage current paths are produced between the upper electrode (for example, Al film) and the metal electrode films 122. As a result, the electric charge generated by polarization are canceled and the d33 value cannot be obtained.

In Comparative Example 3, a crystalline ITO film with a thickness of 50 nm is formed on the substrate 21, and a ZnO layer is formed as the piezoelectric layer 23 on the crystalline ITO film. With the oxygen content of 4.8% in the source gas during film formation of the ITO film, the resultant ITO film becomes crystalline. The FWHM of XRC of Comparative Example 3 is as broad as 10.0°, and the c-axis orientation is out of the acceptable range. When the underlaid electrode film is crystalline, the electric charges generated at the interface of the ZnO layer cannot be detected at the resolution of the measuring instrument used, and d33 value cannot be acquired. On the other hand, because the ITO film is used, the haze value is as high as 1.0, and transparency is obtained.

Figure 7:
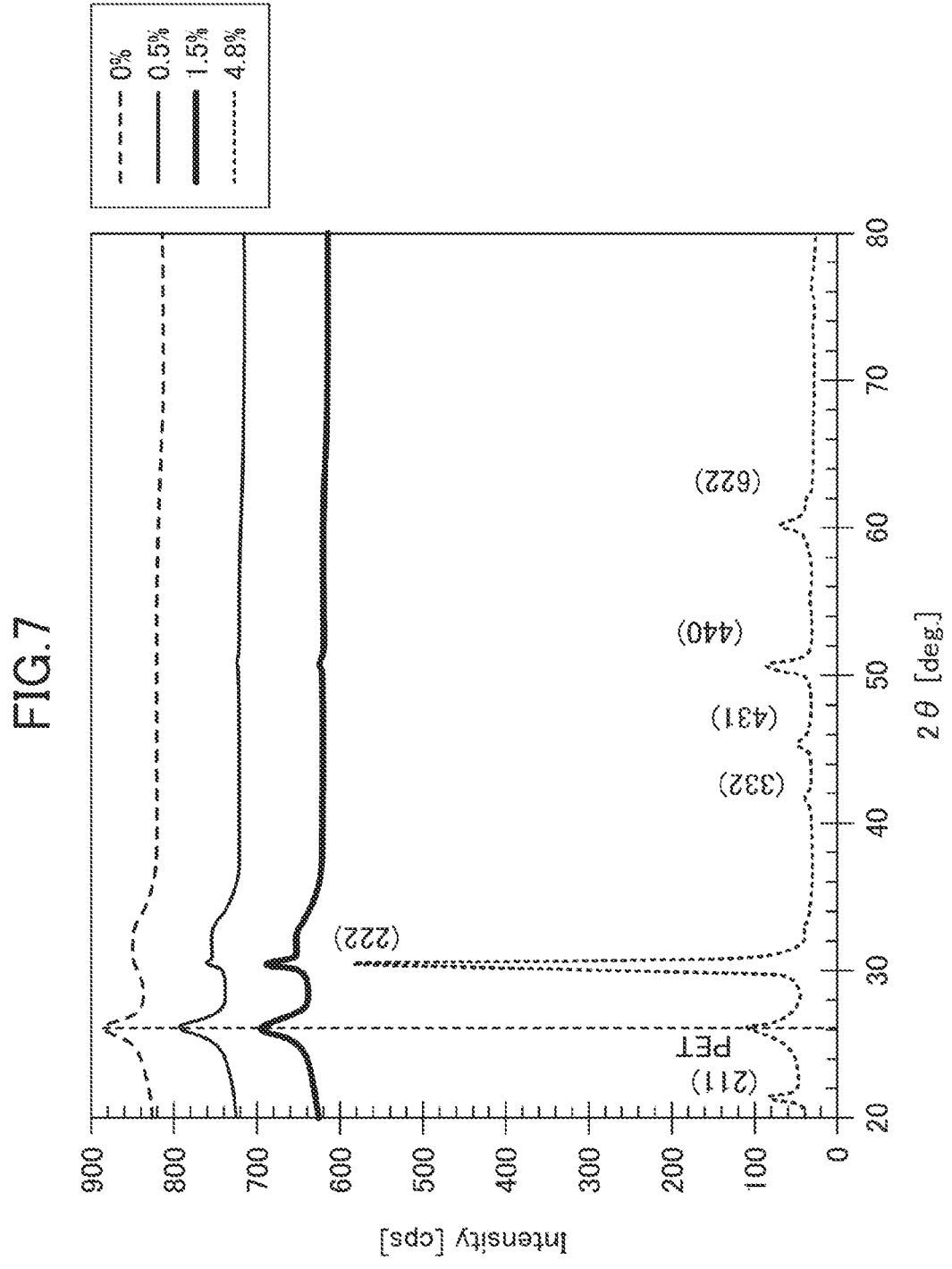
FIG. 7 shows small-angle X-ray diffraction measurement results of samples prepared under different flow ratios of $O_2$ to Ar.

FIG. 7 shows the measurement results of samples prepared under different $O_2/Ar$ flow ratios, measured by grazing incidence X-ray diffraction (GIXD). An ITO film is formed on a PET substrate by changing the ratio of $O_2$ flow to the total flow of Ar gas and $O_2$ to 0%, 0.5%, 1.5%, and 4.8%. Crystalline ITO is defined as one in which multiple peaks from lattice plane orientations are observed by the GIXD method in an as-depo state without thermal annealing after the film formation.

When the $O_2$ ratio to the total flow of Ar gas and $O_2$ is 4.8%, many peaks are observed at different lattice plane orientations, and in particular, the peak at the (222) crystal plane is prominent. The small peak appearing at 26 degrees of $2\theta$ is a peak derived from the PET substrate.

When the $O_2$ ratio to the total flow of Ar gas and $O_2$ is set to 0% and 0.5%, the measurement profiles are almost flat except for the small peaks derived from the PET. Accordingly, the prepared ITO films are amorphous. When the $O_2$ ratio to the total flow of Ar gas and $O_2$ is 1.5%, there is a small peak observed only at the (222) crystal plane, but the peak intensity is less than that of the peak originating from the PET. In this case, it is determined that the film is amorphous.

From this measurement result, the ratio of the $O_2$ flow to the total flow of Ar gas and $O_2$ is set to 0% to 2%, and more preferably 0% to 1.5%. With this range, the first electrode 22 becomes amorphous, which can improve the c-axis orientation, transparency, thereby improving the piezoelectric characteristics of the upper piezoelectric layer.

Comparing the examples of FIG. 4 and the comparative configurations of FIG. 5, it is preferred that at least the electrode provided between the substrate 21 and the piezoelectric layer 23 is formed of an amorphous oxide conductor. With this arrangement, the crystal orientation and piezoelectric characteristics of the piezoelectric layer 23 are improved, and a high-quality piezoelectric device can be achieved. An amorphous electrode film can be acquired by setting the oxygen content of the source for forming the oxide conductor film to 2% or less, and more preferably, to 1.5% or less.

Although the present invention has been described based on specific examples, the invention is not limited to the above-described configurations and fabrication processes. For example, when the first electrode is formed of an amorphous oxide conductor, water may be introduced during the sputtering process to form a low resistance amorphous film on the substrate 21.

The multilayer stack including the electrode of an amorphous oxide conductor and the piezoelectric layer 13 of the invention is applicable not only to a piezoelectric sensor, but also to a piezoelectric device such as a speaker or an oscillator making use of the inverse piezoelectric effect. When an alternating current electric signal is applied to the piezoelectric layer 13, mechanical vibration is generated in the piezoelectric layer 13 according to its resonance frequency. Owing to the presence of the amorphous first electrode 12 under the piezoelectric layer, the c-axis orientation and polarization characteristics of the piezoelectric layer 13 are good, and the operating accuracy as a piezoelectric device can be improved.

Consider a new sentence that states "The entireties of both earlier-filed Japanese patent applications identified above are herein incorporated".

LISTING OF SYMBOLS

10: piezoelectric device
11, 21: substrate
12, 22: first electrode
13, 23: piezoelectric layer
14: second electrode
15: multilayer stack

PRIOR ART DOCUMENT(S)

Patent Document: Published Japanese Translation No. 2015-519720 of the PCT International Application

What is claimed is:

1. A piezoelectric device comprising:
   a multilayer stack in which a first electrode, a piezoelectric layer, and a second electrode are stacked in this order on a substrate,
   wherein
      the piezoelectric layer has a wurtzite crystal structure,
      the piezoelectric layer consists of one type of a piezoelectric material located between the first electrode and the second electrode,
      the piezoelectric layer is in direct contact with the first electrode,
      at least the first electrode is formed of an amorphous oxide conductor,
      the first electrode is formed of a material selected from a group consisting of IZO, IZTO, and IGZO, and
      a thickness of the first electrode is 10 nm or more.

2. The piezoelectric device as claimed in claim 1, wherein the thickness of the first electrode is 10 nm to 200 nm.

3. The piezoelectric device as claimed in claim 2, wherein the thickness of the first electrode is 10 nm to 100 nm.

4. The piezoelectric device as claimed in claim 1, wherein the piezoelectric layer is formed of a material selected as a main component from a group consisting zinc oxide (ZnO), zinc sulfide (ZnS), zinc selenide (ZnSe), zinc telluride (ZnTe), aluminum nitride (AlN), gallium nitride (GaN), cadmium selenide (CdSe), cadmium telluride (CdTe), silicon carbide (SiC), and combinations thereof.

5. The piezoelectric device as claimed in claim 4, wherein the piezoelectric layer contains a subcomponent in the main component, the subcomponent is a material selected from a group consisting of magnesium (Mg), vanadium (V), titanium (Ti), zirconium (Zr), silicon (Si), lithium (Li), and combinations thereof.

6. The piezoelectric device as claimed in claim 1, wherein a d33 value of the piezoelectric layer ranges from 2.2 to 5.0 pC/N.

7. The piezoelectric device as claimed in claim 1, wherein the substrate is formed of a plastic or a resin.

8. The piezoelectric device as claimed in claim 1, wherein the second electrode is formed of an amorphous oxide conductor.

9. A method of manufacturing a piezoelectric device, the method comprising:
   forming a first electrode on a substrate, the first electrode being formed of an amorphous oxide conductor;
   forming a piezoelectric layer having a wurtzite crystal structure on the first electrode; and
   forming a second electrode on the piezoelectric layer, wherein the piezoelectric layer consists of one type of a piezo-electric material located between the first electrode and the second electrode, the piezoelectric layer is in direct contact with the first electrode, the first electrode is formed of a material selected from a group consisting of IZO, IZTO, and IGZO, and a thickness of the first electrode is 10 nm or more.

10. The method as claimed in claim 9, wherein the first electrode is formed by sputtering at room temperature on a plastic substrate or a resin substrate.

11. The method as claimed in claim 9, wherein during formation of the first electrode, a ratio of an oxygen flow to a total flow of argon gas and the oxygen falls within a range of 0% to 2.0%.

\* \* \* \* \*